(12) United States Patent
Taki et al.

(10) Patent No.: US 7,538,407 B2
(45) Date of Patent: May 26, 2009

(54) SEMICONDUCTOR APPARATUS

(75) Inventors: Masato Taki, Aichi-ken (JP); Hideki Tojima, Nagoya (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 476 days.

(21) Appl. No.: 10/576,292

(22) PCT Filed: Oct. 8, 2004

(86) PCT No.: PCT/JP2004/015328

§ 371 (c)(1), (2), (4) Date: Apr. 19, 2006

(87) PCT Pub. No.: WO2005/038921

PCT Pub. Date: Apr. 28, 2005

(65) Prior Publication Data

US 2007/0085595 A1 Apr. 19, 2007

(30) Foreign Application Priority Data

Oct. 20, 2003 (JP) ............................. 2003-359229

(51) Int. Cl.
H01L 29/72 (2006.01)

(52) U.S. Cl. ................... 257/492; 257/296; 257/493; 257/496; 257/513; 257/575; 257/587

(58) Field of Classification Search .............. 257/296, 257/492, 493, 496, 513, 575, 587
See application file for complete search history.

(56) References Cited

U.S. PATENT DOCUMENTS 5,801,418 A * 9/1998 Ranjan ................... 257/336
6,979,850 B2 * 12/2005 Hatade ................... 257/296

(Continued)

FOREIGN PATENT DOCUMENTS

GB 2 310 081 A 8/1997

(Continued)

OTHER PUBLICATIONS

Tomohide Terashima, et al.: A New Level-shifting Technique by divided RESURF Structure, International Symposium on Power Semiconductor Devices and ICs. Feb. 1997 IEEE, pp. 57-60.

(Continued)

Primary Examiner—Edward Wojciechowicz
(74) Attorney, Agent, or Firm—Kenyon & Kenyon LLP

(57) ABSTRACT

A semiconductor apparatus (100) comprises a low potential reference circuit region (1) and a high potential reference circuit region (2), and the high potential reference circuit region (2) is surrounded by a high withstand voltage separating region (3). By a trench (4) formed in the outer periphery of the high withstand voltage separating region (3), the low potential reference circuit region (1) and high potential reference circuit region (2) are separated from each other. Further, the trench (4) is filled up with an insulating material, and insulates the low potential reference circuit region (1) and high potential reference circuit region (2). The high withstand voltage separating region (3) is partitioned by the trench (4), high withstand voltage NMOS (5) or high withstand voltage PMOS (6) is provided in the partitioned position.

22 Claims, 16 Drawing Sheets

U.S. PATENT DOCUMENTS

| | | | |
|---|---|---|---|
| 7,294,901 B2* | 11/2007 | Shimizu | 257/492 |
| 2002/0043699 A1* | 4/2002 | Akiyama | 257/575 |
| 2004/0189353 A1 | 9/2004 | Hatade et al. | |
| 2004/0232522 A1 | 11/2004 | Shimizu | |

FOREIGN PATENT DOCUMENTS

| | | |
|---|---|---|
| JP | 09-055498 | 2/1997 |
| JP | 09-283716 | 10/1997 |
| JP | 09-289319 | 11/1997 |

OTHER PUBLICATIONS

Tatsuhiko Fujihira, et al.: Self-shielding: New High-Voltage Inter-connection Technique for HVICs, International Symposium on Power Semiconductor Devices and ICs, 1996, IEEE, pp. 231-234.

* cited by examiner

(12) United States Patent
US 7,538,407 B2

SEMICONDUCTOR APPARATUS

This is a 371 national phase application of PCT/JP2004/015328 filed 8 Oct. 2004, claiming priority to Japanese Application No. 2003-359229 filed 20 Oct. 2003, the contents of which are incorporated herein by reference.

TECHNICAL FIELD

The present invention relates to a semiconductor apparatus in which both a low potential reference circuit and a high potential reference circuit are incorporated. More particularly, it relates to a semiconductor apparatus equipped with high withstand voltage MOS which transmits signals between a low potential reference circuit and a high potential reference circuit.

BACKGROUND ART

There have conventionally and widely been used semiconductor apparatuses in which both a low potential reference circuit and a high potential reference circuit are incorporated for power apparatuses and the like. A semiconductor apparatus of this kind is generally structured such as shown in FIG. 16. That is, the semiconductor apparatus has a low potential reference circuit region 1 and a high potential reference circuit region 2, and the high potential reference circuit region 2 is surrounded by a high withstand voltage separating region 3 formed with resurf structure or the like. Furthermore, there are arranged high withstand voltage NMOS 5 and high withstand voltage PMOS 6 for signal transmission (level shift) between the low potential reference circuit region 1 and the high potential reference circuit region 2. To be specific, the high withstand voltage NMOS 5 arranged in the low potential reference circuit region 1 is used for level shift from the low potential reference circuit region 1 to the high potential reference circuit region 2. On the other hand, for level shift from the high potential reference circuit region 2 to low potential reference circuit region 1, the high withstand voltage PMOS 6 arranged in the high potential reference circuit region 2 is used. Drain wirings of the high withstand voltage NMOS 5 and the high withstand voltage PMOS 6 are drawn out to a region of output side from its input side crossing over the high withstand voltage separating region 3.

FIG. 17 shows an example of a circuit which conducts level shift from the low potential reference circuit region 1 to the high potential reference circuit region 2. This circuit has a high withstand NMOS 5, a pull-up resistor 101, and a Zener diode 102. Along ON/OFF of the high withstand voltage NMOS 5, there is caused a potential difference at the drain which corresponds to power voltage in a high potential reference circuit region 2. Thereby, level shift is conducted between the low potential reference circuit region 1 and the high potential reference circuit region 2. For example, suppose that power voltages of both the low potential reference circuit region 1 and the high potential reference circuit region 2 are 15V and potential difference between the low potential reference circuit region 1 and the high potential reference circuit region 2 is 1000V. In this case, a signal voltage of which is swung between 0V and 15V in the low potential reference circuit region 1 is converted to a signal swinging between 1000V and 1015V through the circuit of FIG. 17. Thereby, a signal transmitted from the low potential reference circuit region 1 is usable within the high potential reference circuit region 2.

In a semiconductor apparatus which thus conducts level shift between the low potential reference circuit regional and the high potential reference circuit region 2, a signal is transmitted through metal wirings (drain wirings) formed on its surface. Drain wirings cross over the low potential reference circuit region 1, high withstand voltage separating region 3 and the like, and there is an interlayer dielectric in between. In this case, potential difference between drain wirings (high potential) and the surface of the semiconductor device (low potential) is large. As a result, withstand-ability against voltage lowers due to drain wirings. Usually, interlayer dielectric between drain wirings and the surface of the semiconductor device is formed thick for resolving the above-mentioned problem. However, in case of a semiconductor apparatus of which potential difference between a high potential reference circuit region and a low potential reference circuit region exceeds 600V, it leads complication of wiring process due to thickened interlayer dielectric, cost-up, and the like.

As technology to resolve the above-mentioned problem, Patent Document 1, for example, discloses a semiconductor apparatus in which a high withstand voltage separating region and drift layer of a high withstand MOS for level shift are formed as a package and a drain is formed in a circuit region at output side. In this document, it is stated that level shift can be done without causing a problem regarding withstand-ability of voltage, since drain wirings are wired without crossing over a high withstand voltage separating region or a low potential reference circuit region.

Furthermore, in addition to the above, Patent Document 2, for example, discloses a semiconductor apparatus in which a portion of an N type high withstand voltage separating region is partitioned with a P type slit region and a high withstand voltage NMOS for level shift is formed at the partitioned portion. That is, N type drain region of a high withstand voltage NMOS and N type layer within a high potential reference circuit region are made to face each other sandwiching a P type slit region. Furthermore, drain wirings of high potential are arranged above the slit region. In this semiconductor apparatus, the slit region is pinched off (depletion regions formed with both of N type layers are incorporated into one). By pinching off the slit. region, a surface of the P type slit region has potential almost same as N type layers at its both sides. It is stated that influence of drain wirings is restrained thereby.

Furthermore, in addition to the above, Patent Document 3, for example, discloses a semiconductor apparatus of SOI structure. This semiconductor apparatus is provided with an insulating region which extends from the main surface of semiconductor apparatus to the buried insulating layer and with a drain wiring above the insulating region. It is stated that influence of drain wirings is restrained because intervals of drain wirings (high potential) and semiconductor layer can be made large.

[Patent Document 1] JP Laid-Open Patent Publication No. 9-55498
[Patent Document 2] JP Laid-Open Patent Publication No. 9-283716
[Patent Document 3] JP Patent Publication No. 3201719

The above-referenced documents disclose inventions to prevent potential difference between drain wirings and a surface of a semiconductor device from being large when level shift is done. However, semiconductor apparatuses in the above-reference documents have had following problems.

That is, regarding the semiconductor apparatus of Patent Document 1, in case high withstand voltage MOS is an NMOS, N drain layer of the NMOS is formed in contact with N type layer of the high potential reference circuit region. Therefore, the N drain layer of the high withstand voltage NMOS and N type layer of the high potential reference circuit region are electrically connected to each other. Therefore, there is required a system to enlarge parasitic resistance between the N drain layer of the high withstand voltage NMOS and the N type layer in the high potential reference circuit region. For that reason, in the semiconductor apparatus of the Patent Document 1, the high withstand voltage separating region is bent toward the low potential reference circuit region to form the high withstand voltage NMOS on the bent portion. That is, parasitic resistance is made large by making a distance between the N drain layer of the high withstand voltage NMOS and the N type layer in the high potential reference circuit region long. However, bending the high withstand voltage separating region leads to increase of chip area, which is obstacle to miniaturization of a substrate, as entirety. Furthermore, since it is impossible to completely insulate the N drain layer of the high withstand NMOS and the N type layer in the high potential reference circuit region, leak current is inevitable. Therefore, excessive power consumption occurs.

Furthermore, in the semiconductor apparatus of Patent Document 2, positioning of N drain layer of the high withstand voltage NMOS and N type layer in the high potential reference circuit region is intended to generate depletion layer between those N type layers. However, in case distance between the two N type layers is too short, punch-through breakdown occurs between N drain layer of the high withstand voltage NMOS and N type layer in the high potential reference circuit region. That is, distance between the two N type layers must be determined taking trade-off relation of voltage withstand-ability and punch-through breakdown into consideration. Therefore, the trade-off relation is not always satisfied depending on required specification voltage and specification voltage restricts the trade-off balance.

Furthermore, as to a semiconductor apparatus disclosed in Patent Document 3, thickness of an insulating region formed below drain wiring must be made thick. Patent Document 3 describes that the insulating region is formed by means of LOCOS method (localized oxidation of silicon method). However, thickness of oxidation film feasible with LOCOS method is of about 1 to 2 μm. Accordingly, the LOCOS method is not applicable to high withstand voltage type devices. Furthermore, other than LOCOS method, there can be conceived of another method that a trench is formed at semiconductor layer and oxide film or poly crystal silicon layer is embedded inside the trench. However, with this method, thickening the insulating region is not sufficient for enhancing voltage withstand-ability between drain wiring and the semiconductor layer, and width of the insulating layer must be taken wide to some extent. In this connection, in case a wide trench exceeding 2 μm is formed, it is difficult to fill the trench with oxide film or poly crystal silicon film inside, which lacks feasibility. Furthermore, in the semiconductor apparatus of Patent Document 3, the semiconductor layer constituting devices is separated by the insulating region. Therefore, potential distribution gets uneven at the border portion of the semiconductor region and the insulating region and electric field is likely to concentrate at the border.

The present invention has been made to resolve problems the above mentioned conventional semiconductor apparatuses have had. That is, the present invention intends to provide a semiconductor apparatus incorporating both low potential reference circuits and high potential reference circuits, capable of conducting level shift between the low potential reference circuits and high potential reference circuits and excellent in compact design and voltage withstand-ability.

DISCLOSURE OF THE INVENTION

To resolve the above-described problems, according to a first aspect of the present invention, there is provided a semiconductor apparatus containing a low potential reference circuit region and a high potential reference circuit region between which signals are transmitted, the semiconductor apparatus comprising: a high withstand voltage separating region arranged between the low and high potential reference circuit regions; a relay semiconductor device for transmitting a signal from one of the low and high potential reference circuit regions to the other of them; and an insulating partition arranged between at least one of the low and high potential reference circuit regions and the relay semiconductor device, the insulating partition being filled with insulating material in a trench, wherein output wiring of the relay semiconductor device is wired to an output one of the low and high potential reference circuit regions bridging over the insulating partition.

In the inventive semiconductor apparatus, the high withstand voltage separating region partitions regions for low and high potential reference circuits. In the high withstand voltage separating region, there is arranged a relay semiconductor device for conducting level shift between the low and high potential reference circuits. Output wiring of the relay semiconductor device is wired to a circuit region of output side bridging over the insulating partition. That is, in case of a relay semiconductor device for level shift from a low potential reference circuit to a high potential reference circuit, an insulating partition is provided between a region for a high potential reference circuit and the relay semiconductor device. Also, in case of a relay semiconductor device for level shift from a high potential reference circuit to a low potential reference circuit, an insulating partition is provided between a region for a low potential reference circuit and the relay semiconductor device. Thereby, the output wiring of the relay semiconductor device does not bridge over surface of semiconductor region which has large gap in potential. Accordingly, the semiconductor region is not influenced by the potential of output wiring. Furthermore, the insulating partition prevents punch-through between the relay semiconductor device and the circuit region of output side. Furthermore, since voltage withstand-ability can be adjusted by changing size of an insulating partition, design can be changed easily even if required voltage differs.

Furthermore, it is preferable that, the semiconductor apparatus according to the first aspect of the present invention further comprises a substrate region arranged below the low and high potential reference circuit regions, wherein bottom portion of the insulating partition extends to the substrate region, and the insulation partition surrounds the relay semiconductor device. Alternatively, it is also preferable the semiconductor apparatus according to the first aspect of the present invention further comprises: a substrate region arranged below the low and high potential reference circuit regions; and an insulating layer embedded between the low and high potential reference circuit regions and the substrate region, the insulating layer electrically insulating the low and high potential reference circuit regions from the substrate region, wherein bottom portions of the insulating partitions extend to the insulating layer and the insulation partitions surround the relay semiconductor devices. Thereby, the relay semiconductor device is insulated from the low and high potential reference circuits, and occurrence of leak current is prevented. Therefore, it is not required to provide meander portion for enhancing parasitic resistance, which realizes miniaturization of an entirety of a semiconductor apparatus.

Furthermore, it is also preferable that the semiconductor apparatus according to the first aspect of the present invention further comprises a group of insulating partitions arranged between the low and high potential reference circuit regions, the group of insulating partitions dividing space between the low and high potential reference circuit regions into plural regions. Thereby, potential on the main surface in the high withstand voltage separating region elevates gradually from the low potential reference circuit region toward the high potential reference circuit region. Accordingly, a problem of field concentration is relaxed.

According to a second aspect of the present invention, there is provided a semiconductor apparatus containing a low potential reference circuit region and a high potential reference circuit region between which signals are transmitted, the semiconductor apparatus comprising relay semiconductor devices for transmitting signals between the low and high potential reference circuit regions, each relay semiconductor device being surrounded with an insulating partition filled with insulating material in a trench, wherein the relay semiconductor devices are arranged to form a ring shape which separates the low and high potential reference circuit regions, and output wiring of each relay semiconductor device is wired to an output one of the low and high potential reference circuit regions bridging over the insulating partition. With this inventive semiconductor. apparatus also, punch-through and leak current are avoided between the relay semiconductor device and the circuit region of output side. Furthermore, the low and high potential reference circuits are partitioned with the relay semiconductor devices, potential distribution is constant at any portion of the semiconductor apparatus. Thereby, a problem of field concentration is relaxed.

Furthermore, according to a third aspect of the present invention, there is provided a semiconductor apparatus comprising: a semiconductor substrate of first conduction type; a first region of second conduction type formed above the semiconductor substrate, the first region constituting a low potential reference circuit region; a second region of second conduction type formed above the semiconductor substrate apart from the first region, the second region constituting a high potential reference circuit region; a third region arranged between the first and second regions, formed in a ring shape surrounding one of the first and second regions, the third region constituting a high withstand voltage terminal region; a fourth region arranged forming an incorporated ring structure together with the third region, the fourth region constituting a relay semiconductor device region for transmitting a signal between the first and second regions; and an insulating partition arranged between at least one of the first and second regions and the fourth region, the insulating partition being filled with insulating material in a trench, wherein output wiring of a relay semiconductor device in the fourth region is wired to an output one of the low and high potential reference circuit regions bridging over the insulating partition.

Furthermore, according to a fourth aspect of the present invention, there is provided a semiconductor apparatus comprising: a semiconductor substrate of either first or second conduction type; an insulating film formed on the semiconductor substrate; a first region of second conduction type formed on the insulating film, the first region constituting a low potential reference circuit region; a second region of second conduction type formed on the insulating film apart from the first region, the second region constituting a high potential reference circuit region; a third region arranged between the first and second regions, formed in a ring shape surrounding one of the first and second region, the third region constituting a high withstand voltage terminal region; a fourth region arranged forming an incorporated ring structure together with the third region, the fourth region constituting a relay semiconductor device region for transmitting a signal between the first and second region; and an insulating partition arranged between at least one of the first and second regions and the fourth region, the insulating partition being filled with insulating material in a trench, wherein output wiring of a relay semiconductor device in the fourth region is wired to an output one of the low and high potential reference circuit regions bridging over the insulating partition. it is to be noted that the semiconductor substrate is a region of which density is higher in comparison with the first and second regions.

It is preferable that in the semiconductor apparatus according to the third or fourth aspect of the present invention, bottom portion of the insulating partition extends to either the semiconductor substrate or the insulating film, and the insulating partition surrounds periphery of a relay semiconductor device in the fourth region from at least three directions, or the third region composes junction isolation type structure in which high withstand voltage is maintained by PN junction.

It is also preferable that, in the semiconductor apparatus according to the third or fourth aspect of the present invention, the third region has insulation isolation type structure in which high withstand voltage is maintained by a plurality of insulating partitions. It is further preferable that, regions partitioned by the insulating partitions have capacitor structure in which the insulating partitions works as dielectric film, and potential elevates gradually from the first region side toward the second region side.

Furthermore, according to a fifth aspect of the present invention, there is provided a semiconductor apparatus comprising: a semiconductor substrate of first conduction type; a first region of second conduction type formed above the semiconductor substrate, the first region constituting a low potential reference circuit region; a second region of second conduction type formed above the semiconductor substrate apart from the first region, the second region constituting a high potential reference circuit region; a plurality of fourth regions arranged between the first and second regions, formed in a ring shape surrounding one of the first and second regions, the fourth regions constituting relay semiconductor device regions for transmitting signals between the first and second regions; and an insulating partition arranged between at least one of the first and second regions and the fourth regions, the insulating partition being filled with insulating material in a trench, wherein output wiring of a relay semiconductor device in a fourth region is wired to an output one of. the low and high potential reference circuit region bridging over the insulating partition.

Furthermore, according to a sixth aspect of the present invention, there is provided a semiconductor apparatus comprising: a semiconductor substrate of either first or second conduction type; an insulating film formed on the semiconductor substrate; a first region of second conduction type formed on the insulating film, the first region constituting a low potential reference circuit region; a second region of second conduction type formed on the insulating film apart from the first region thereon, the second region constituting a high potential reference circuit region; a plurality of fourth regions arranged between the first and second regions, formed in a ring shape surrounding one of the first and second regions, the fourth regions constituting relay semiconductor device regions for transmitting signals between the first and second regions; and an insulating partition arranged between at least one of the first and second regions and the fourth regions, the insulating partition being filled with insulating material in a trench, wherein output wiring of a relay semiconductor device in a fourth region is wired to an output one of the low and high potential reference circuit region bridging over the insulating partition.

BEST MODE FOR CARRYING OUT THE INVENTION

Exemplary embodiments of the invention are specifically described below while referring to the accompanying drawings. The following exemplary embodiments show the application of the invention in power MOS mounted on an electric vehicle, for example.

First Exemplary Embodiment

Figure 1:
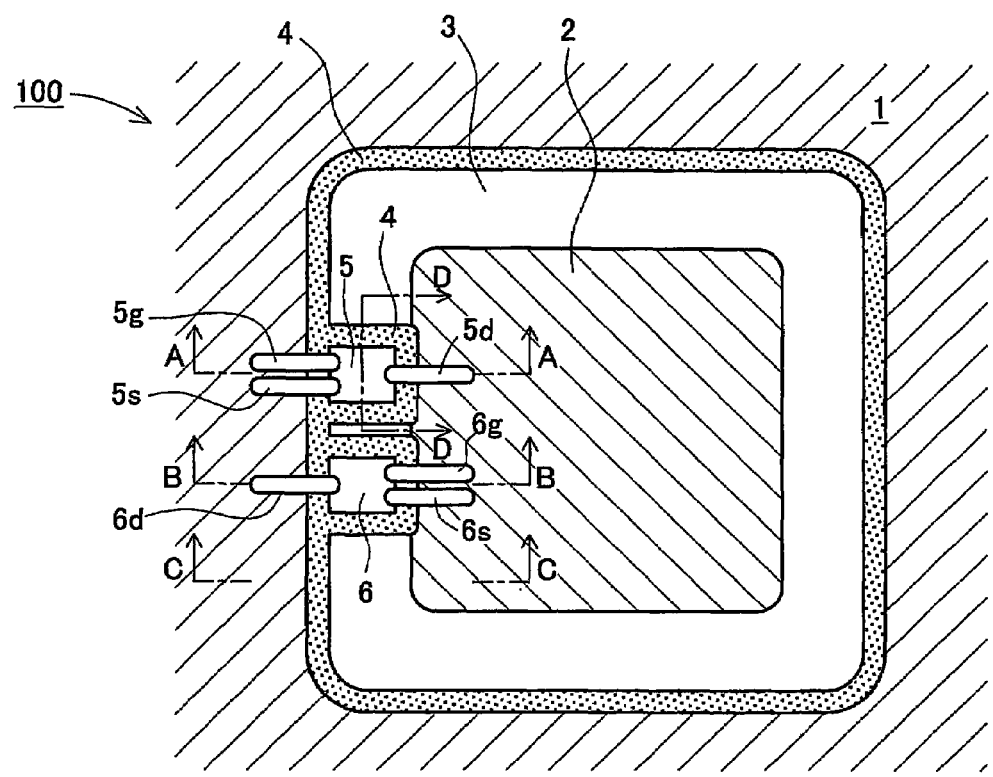
FIG. 1 is a plan view showing structure of a semiconductor apparatus directed to a first exemplary embodiment.
Figure 16:
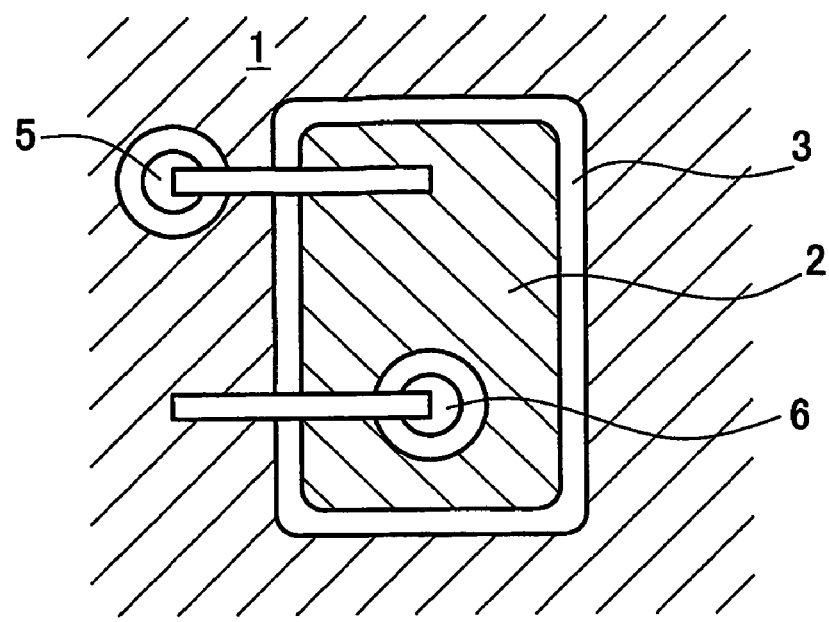
FIG. 16 is a plan view showing structure of a conventional semiconductor apparatus.
Figure 17:
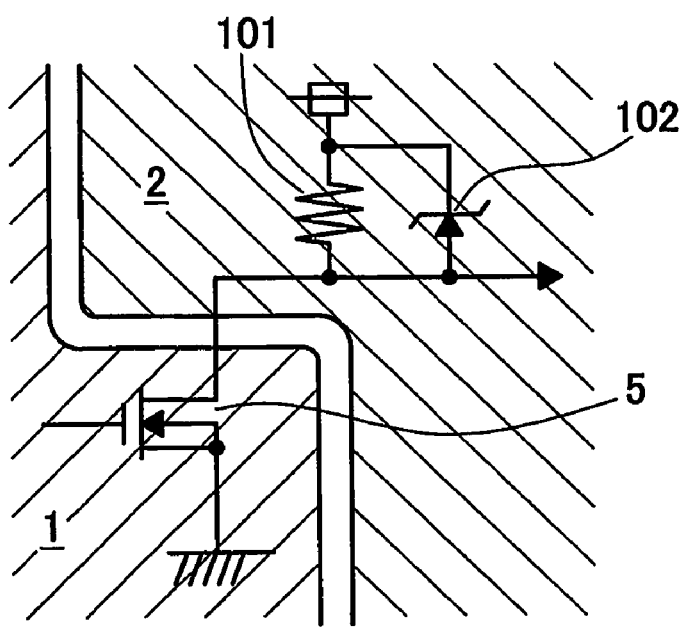
FIG. 17 shows circuit structure the conventional semiconductor apparatus.

A semiconductor apparatus 100 in a first exemplary embodiment has a structure as shown in a plan view in FIG. 1. Same reference numerals as the components of the conventional semiconductor apparatus shown in FIG. 16 represent identical functions. The semiconductor apparatus 100 comprises a low potential reference circuit region 1 and a high potential reference circuit region 2, and the high potential reference circuit region 2 is surrounded by a high withstand voltage separating region 3, which is known as resurf structure. By this high withstand voltage separating region 3, the low potential reference circuit region 1 and high potential reference circuit region 2 are separated from each other. Further, a trench 4 is formed at the outer periphery of the high withstand voltage separating region 3. The trench 4 is filled up with insulating material such as silicon oxide. Accordingly, the high potential reference circuit region 2 is isolated from the low potential reference circuit region 1. Parts of the high withstand voltage separating region 3 are partitioned by the trench 4. A high withstand voltage NMOS 5 and a high withstand voltage PMOS 6 are provided in the partitioned areas. Such MOS is intended to transmit signal (shift level) between the low potential reference circuit region 1 and high potential reference circuit region 2. More specifically, for level shifting from the low potential reference circuit region 1 to the high potential reference circuit region 2, the high withstand voltage NMOS 5 having a drain wiring 5d disposed on the high potential reference circuit region 2 is used. On the other hand, for level shifting from the high potential reference circuit region 2 to the low potential reference circuit region 1, the high withstand voltage PMOS 6 having a drain wiring 6d disposed on the low potential reference circuit region 1 is used.

Figure 2:
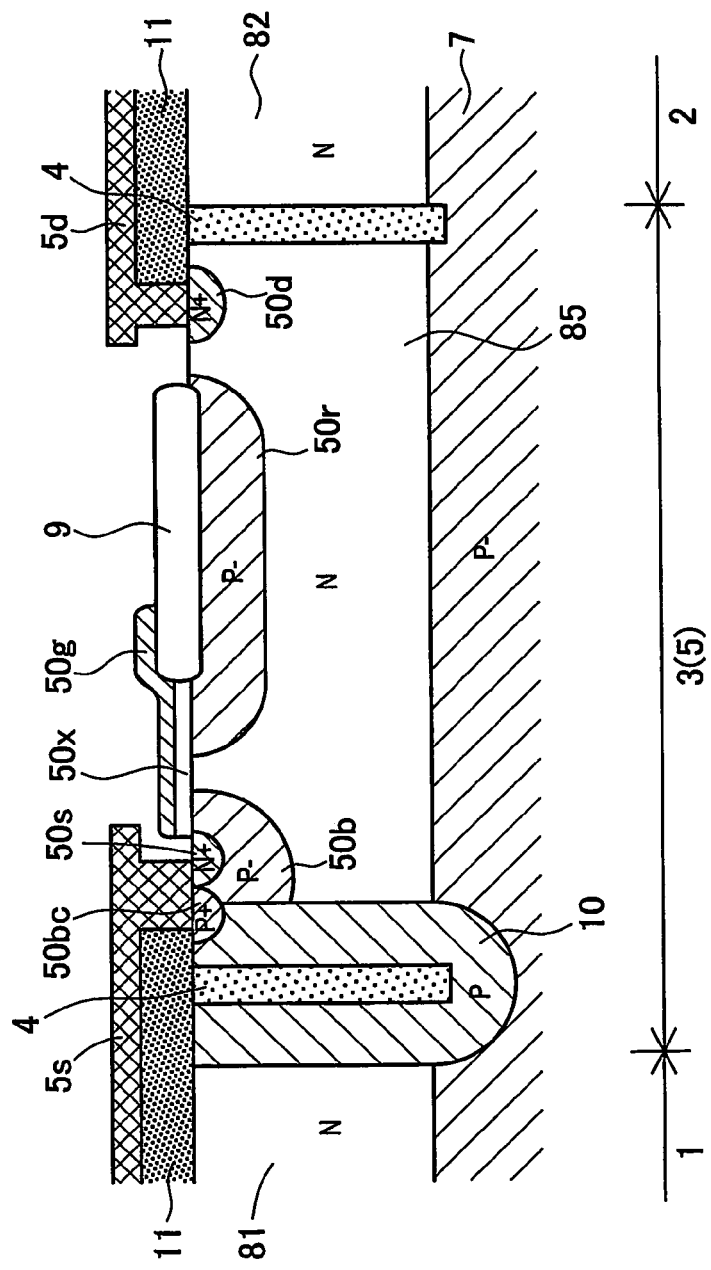
FIG. 2 is a sectional view showing structure of A-A section of the semiconductor apparatus directed to FIG. 1.

FIG. 2 is a sectional view of A-A in the semiconductor apparatus 100 shown in FIG. 1. That is, it is a sectional view of the high withstand voltage NMOS 5. The high withstand voltage NMOS 5 is formed in an area partitioned by the trench 4, out of N type epitaxial layers (low potential reference N type layer 81, high potential reference N type layer 82, and in-NMOS drift layer 85) formed on a P$^-$ type substrate 7. The high withstand voltage NMOS 5 includes gate poly silicon 50g, gate oxide film 50x, source N$^+$ region 50s, drain N$^+$ region 50d, body P$^-$ region 50b, and body contact P$^+$ region 50bc. The gate 50g, source 50s, and drain 50d form a semiconductor transistor that operates in the manner of a relay within the high withstand voltage NMOS 5 region. The NMOS 5 region has formed within it a semiconductor relay device comprising the gate 50g, the source 50s, and the drain 50d. It further includes resurf P$^-$ region 50r biased at the same potential (usually 0 V) as the body P$^-$ region 50b. Moreover, in-NMOS drift layer 85, field oxide film 9, separation-purpose P$^+$ diffusion region 10, and others are provided. As shown in FIG. 1, gate wiring 5g (not shown in FIG. 2), source wiring 5s, and drain wiring 5d are provided on the surface of the semiconductor apparatus 100, and the level is shifted by these wirings. An interlayer insulating film 11 is formed between these wirings 5g, 5s, 5d and the N type epitaxial layer. In the high withstand voltage NMOS 5 having such structure, by application of voltage to the gate poly silicon 50g, a channel effect is produced in the body P$^-$ region 50b, and thereby the conduction between the source N$^+$ region 50s and drain N$^+$ region 50d is controlled.

Figure 3:
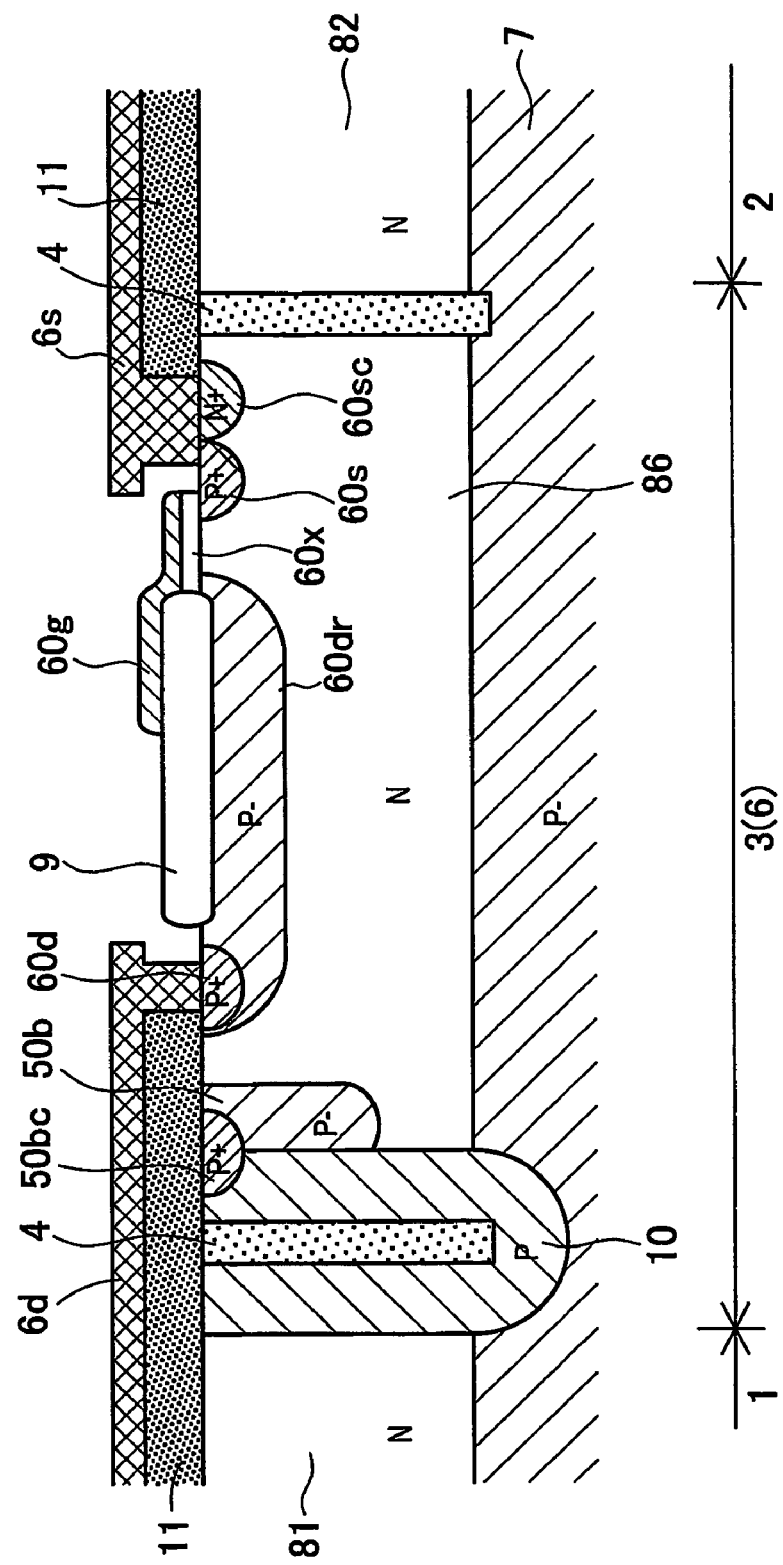
FIG. 3 is a sectional view showing structure of B-B section of the semiconductor apparatus directed to FIG. 1.

FIG. 3 is a sectional view of B-B in the semiconductor apparatus 100 shown in FIG. 1. That is, it is a sectional view of the high withstand voltage PMOS 6. The high withstand voltage PMOS 6 is also formed in an area partitioned by the trench 4, out of N type epitaxial layers (low potential reference N type layer 81, high potential reference N type layer 82, and in-PMOS N type layer 86) formed on the P$^-$ type substrate 7. The high withstand voltage PMOS 6 includes gate poly silicon 60g, gate oxide film 60x, source P$^+$ region 60s, drain P$^+$ region 60d, and sub contact N$^+$ region 60sc. The gate 60g, source 60s, and drain 60d form a semiconductor transistor that operates in the manner of a relay within the high withstand voltage PMOS 6 region. The PMOS 6 region has formed within it a semiconductor relay device comprising the gate 60g, the source 60s, and the drain 60d. It further includes drift P⁻ region 60dr formed in a same diffusion layer as the resurf P⁻ region 50r in the high withstand voltage NMOS 5. Moreover, same as in the high withstand voltage NMOS 5, field oxide film 9, separation-purpose P⁺ diffusion region 60, and others are provided. As shown in FIG. 1, gate wiring 6g (not shown in FIG. 3), source wiring 6s, and drain wiring 6d are provided for shifting the level. In the high withstand voltage PMOS 6 having such structure, by application of voltage to the gate poly silicon 60g, a channel effect is produced in the in-PMOS N type layer 86, and thereby the conduction between the source P⁺ region 60s and drain P⁺ region 60d is controlled.

Figure 4:
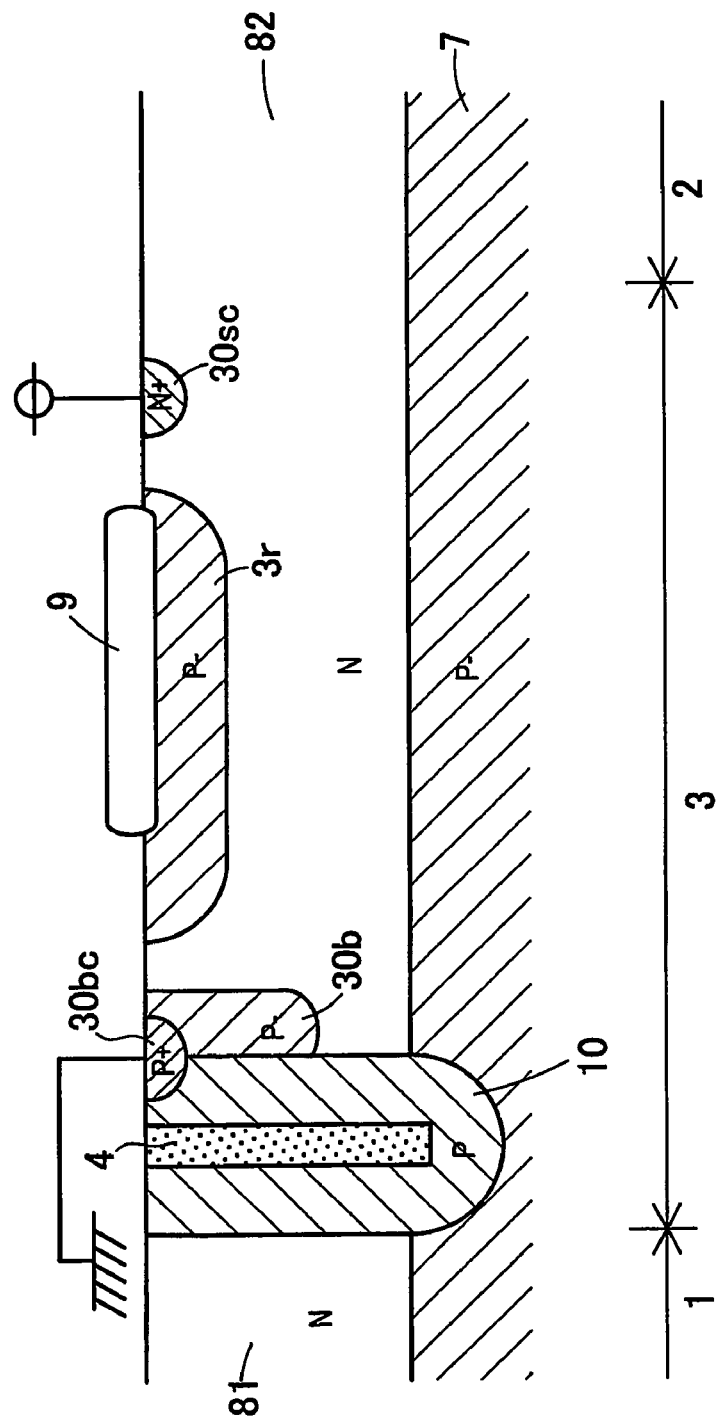
FIG. 4 is a sectional view showing structure of C-C section of the semiconductor apparatus directed to FIG. 1.

FIG. 4 is a sectional view of C-C in the semiconductor apparatus 100 shown in FIG. 1. That is, it is a sectional view of the high withstand voltage separating region 3. Compared with the high withstand voltage NMOS 5 in FIG. 2, the high withstand voltage separating region 3 is similar to the high withstand voltage NMOS 5, except that the trench 4 and gate poly silicon 50g at the side of the high potential reference circuit region 2 are not needed. The P type diffusion regions 30b, 30bc in the high withstand voltage separating region 3 respectively correspond to the body P⁻ region 50b and body contact P⁺ region 50bc in the high withstand voltage NMOS 5. The N type diffusion region 30sc corresponds to the sub contact N⁺ region 60sc in the high withstand voltage PMOS 6. The surface potential distribution is designed to be nearly identical with that in the high withstand voltage NMOS 5 and high withstand voltage PMOS 6.

Figure 5:
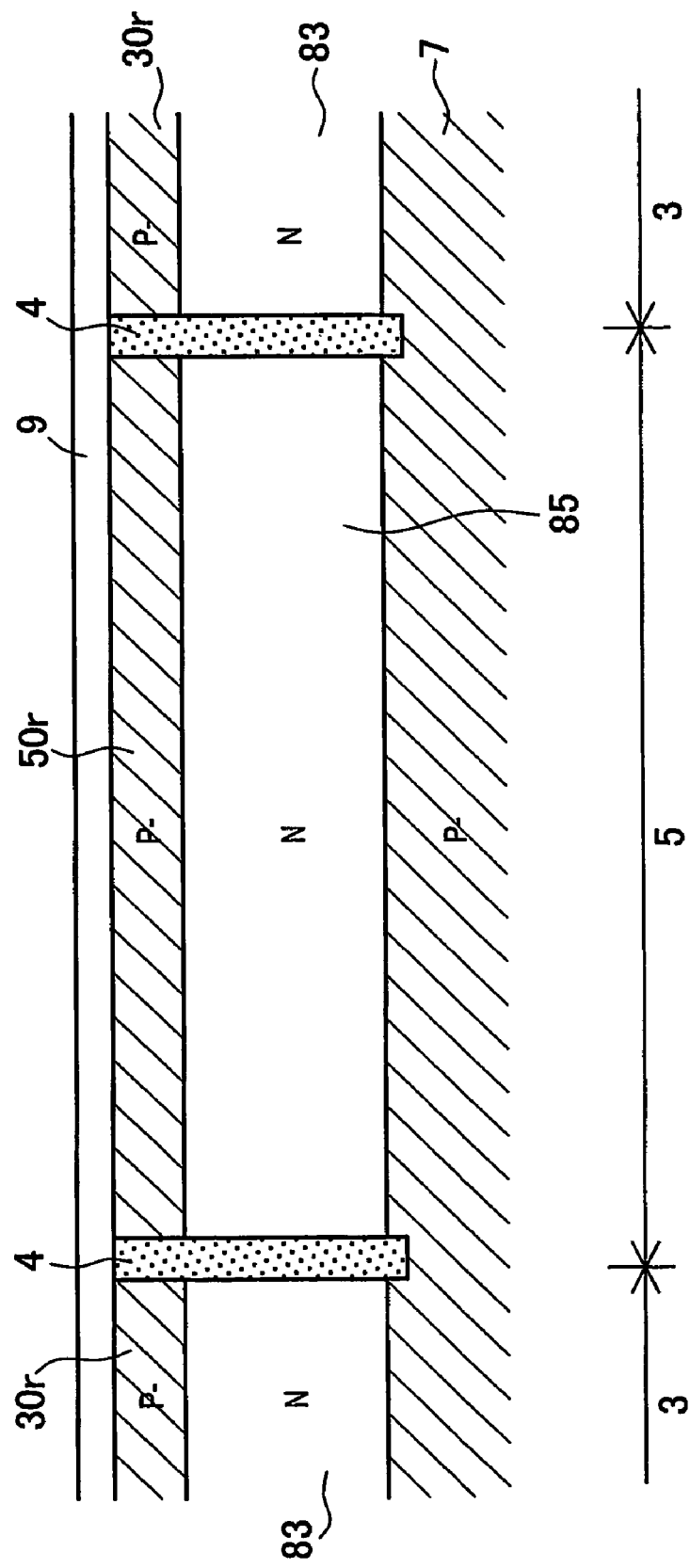
FIG. 5 is a sectional view showing structure of D-D section of the semiconductor apparatus directed to FIG. 1.

FIG. 5 is a sectional view of D-D in the semiconductor apparatus 100 shown in FIG. 1. That is, it is a sectional view of the high withstand voltage NMOS 5 orthogonal to the section in FIG. 2. The high withstand voltage NMOS 5 is surrounded by the trench 4, and the bottom of the trench 4 reaches up to the P⁻ type substrate 7. Accordingly, the in-NMOS drift layer 85 is electrically isolated from the separating region N type layer 83, as well as the low potential reference N type layer 81 and high potential reference N type layer 82.

It is a feature of the semiconductor apparatus 100 of the embodiment that the high withstand voltage NMOS 5 and high withstand voltage PMOS 6 are disposed in a region where the high withstand voltage separating region 3 is partitioned by the trench 4. In the semiconductor apparatus 100, high potential drain wiring 5d of high withstand voltage NMOS 5 does not straddle over low potential portion. And also, low potential drain wiring 6d of high withstand voltage PMOS 6 does not straddle over high potential portion. Hence, there is no problem of withstand voltage. This is same as in the semiconductor apparatus in Patent Document 1 and others, but in the semiconductor apparatus 100, the high withstand voltage NMOS 5 is completely separated from the high potential reference circuit region 2 by the trench 4 Accordingly, leak current or punch-through breakdown does not occur between the drain N⁺ region 50d and high potential reference N type layer 82. Therefore, the meander portion as in the semiconductor apparatus in Patent Document 1 is not needed, and the area loss is suppressed. Differently from the semiconductor apparatus in Patent Document 2, it is not required to consider trade-off between withstand voltage and punch-through breakdown, and limitation of operating voltage is not required. In the semiconductor apparatus 100 of the embodiment, the withstand voltage between the drain wiring 5d and substrate is determined by the depth of the trench 4. The withstand voltage between the drain N⁺ region 50d and high potential reference N type layer 82 is determined by the width of the trench 4. Hence, required withstand voltage can be realized by the size of the trench 4.

As compared with the width of the P type slit region exposed on the surface in the semiconductor apparatus in Patent Document 2, the width of the trench 4 in the semiconductor apparatus 100 of the embodiment is smaller. Accordingly, as compared with the semiconductor apparatus in Patent Document 2, area loss is smaller.

More specifically, the width 2L of the P type slit region must satisfy at least the following formula (1) in order to assure the withstand voltage corresponding to the punch-through breakdown, for the apparatus of Patent Document 2.

$$2L > \sqrt{(2\epsilon V_{PT}/qN_p)} \quad (1)$$

where "$\epsilon$" is dielectric constant of silicon, "$V_{PT}$" is withstand voltage relative to punch-through breakdown, "q" is electric charge of electron, and "$N_p$" is concentration of P type substrate. For example, in the case of punch-through withstand voltage $V_{PT}$=50 V, and substrate concentration $N_p$=1.0×10¹⁴ cm⁻³ generally used in high withstand voltage semiconductor apparatus of 1000 V class, 2L ≈26 μm according to formula (1).

On the other hand, in the semiconductor apparatus 100 of the embodiment, when using silicon oxide film as trench 4, generally, a film thickness may be selected so as to be 3 MV/cm or less. It is enough at about 170 nm to obtain a withstand voltage of 50 V. Hence, as compared with the semiconductor apparatus in Patent Document 2, area loss is smaller.

In the semiconductor apparatus 100 of the embodiment, since the trench 4 is formed, number of processes is increased as compared with the conventional semiconductor apparatus. However, by applying the trench 4 in separation from other circuits of bipolar transistor and/or CMOS installed in the semiconductor apparatus 100, chip area can be saved substantially. Hence, total cost can be rather lowered. In particular, in this kind of high withstand voltage semiconductor device, other circuits of CMOS and so on are mounted on the N type epitaxial layer formed on the P⁻ type substrate 7 of high resistance. Accordingly, the thickness of this N type epitaxial layer is designed so as to assure a thickness not to cause punch-through breakdown between the P type well region for CMOS and P⁻ type substrate 7 or between P type base region for bipolar transistor and P⁻ type substrate 7. For example, to mount a circuit of 35V system, generally, the thickness of the N type epitaxial layer is required to be 25 μm or more. When separation-purpose P⁺ diffusion region is formed by thermal diffusion as in the prior art, the width of the region, is required to be 15 μm or more along with spread in the width direction. Hence, in the method of separating the region by the P⁺ diffusion region, as compared with the method. of separating the region by the trench 4 as in the embodiment, area loss is greater. Therefore, the use of the trench 4 does not always lead to elevation of total cost.

Second Exemplary Embodiment

Figure 6:
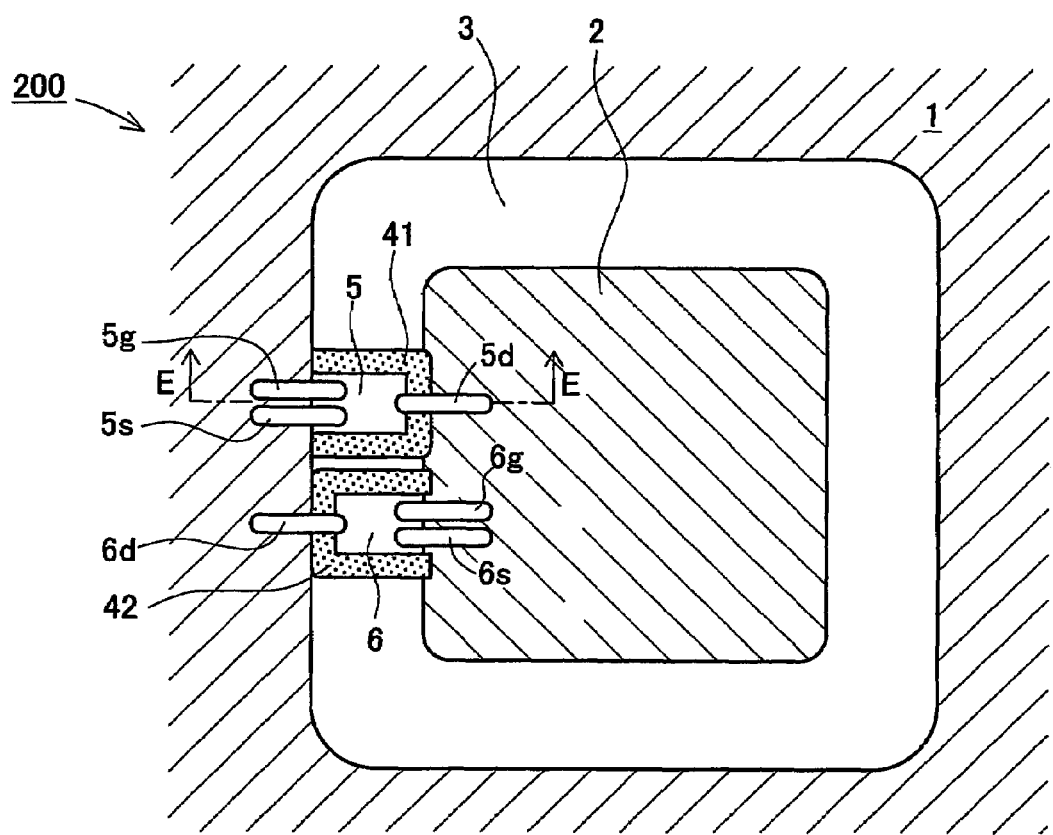
FIG. 6 is a plan view showing structure of a semiconductor apparatus directed to a second exemplary embodiment.

A semiconductor apparatus 200 in a second exemplary embodiment has a structure as shown in a plan view in FIG. 6. The semiconductor apparatus 200 comprises a low potential reference circuit region 1 and a high potential reference circuit region 2, and the high potential reference circuit region 2 is surrounded by a high withstand voltage separating region 3 same as in the semiconductor apparatus 100 in the first exemplary embodiment. Further, trenches 41, 42 are formed in part of the high withstand voltage separating region 3, and the high withstand voltage separating region 3 is partitioned into plural regions. A high withstand voltage NMOS 5 and high withstand voltage PMOS 6 are provided in the partitioned areas. What differs from the semiconductor apparatus 100 in the first exemplary embodiment is that the trenches 41, 42 do not surround completely high withstand voltage NMOS 5 and high withstand voltage PMOS 6, respectively. More specifically, trenches are not formed at the source wiring sides. Still more, no trench is formed at the outer periphery of the high withstand voltage separating region 3.

Figure 7:
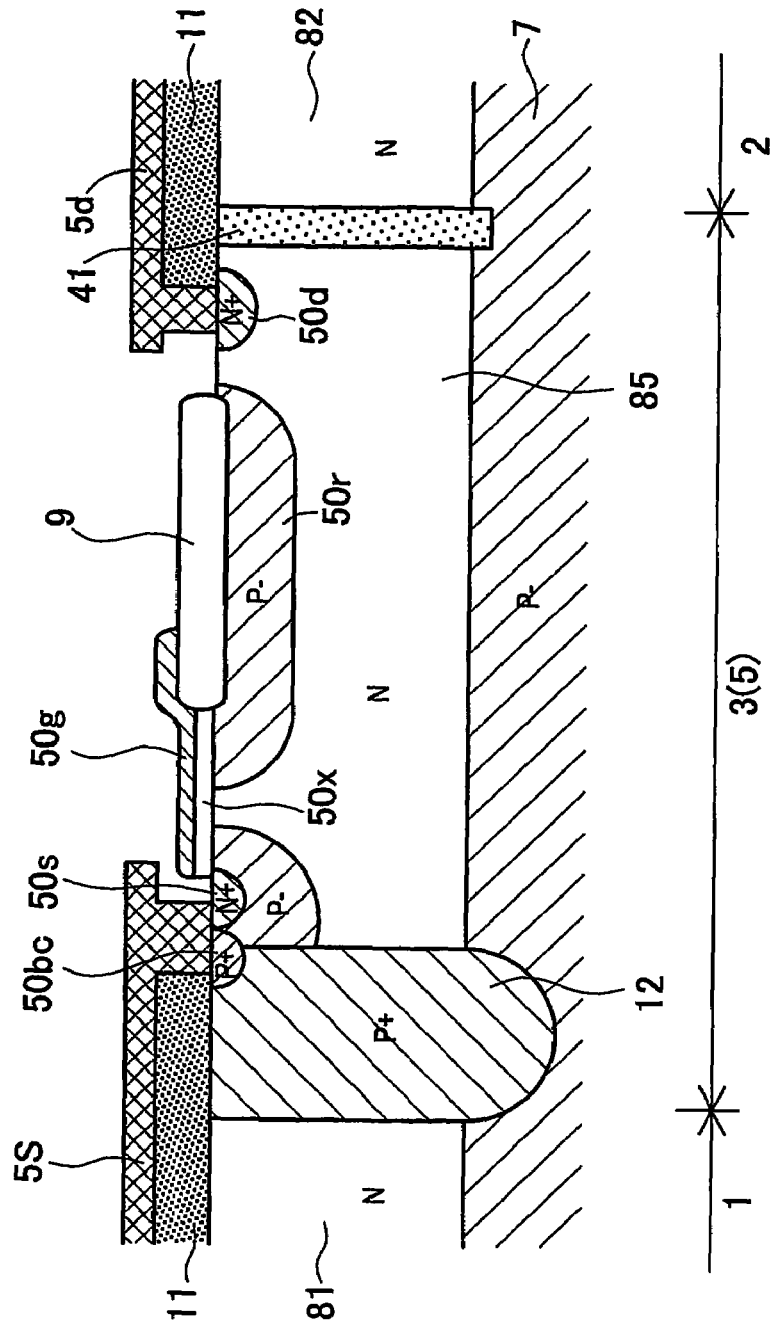
FIG. 7 is a sectional view showing structure of E-E section of the semiconductor apparatus directed to FIG. 6.

FIG. 7 is a sectional view of E-E in the semiconductor apparatus 200 shown in FIG. 6. It is a sectional view of high withstand voltage NMOS 5. The high withstand voltage NMOS 5 is formed in N type epitaxial layers (low potential reference N type layer 81, high potential reference N type layer 82, and in-NMOS drift layer 85) disposed on a P⁻ type substrate 7. What differs from the semiconductor apparatus 100 in the first exemplary embodiment is that trench 41 is not present at the side of source wiring 5s. Instead, the low potential reference N type layer 81 and in-NMOS drift layer 85 are separated by separation-purpose P⁺ diffusion region 12 of which bottom reaches up to the P⁻type substrate 7. Hence, potential of the P⁻ type substrate 7 is set. On the other hand, the in-NMOS drift layer 85 and high potential reference N type layer 82 are separated by means of the trench 41. Further, of the trench 41, by disposing the left end in FIG. 6 at the left side of the source N⁺ region 50s or more left, the high potential reference region 2 and high withstand voltage. NMOS 5 are isolated. Hence, leak current or punch-through breakdown does not occur between the high withstand voltage NMOS 5 and high potential reference circuit region 2. Further, as compared with the semiconductor apparatus 100 in the first exemplary embodiment, the total trench volume is smaller. Hence, the yield is higher in fabrication of trenches.

Third Exemplary Embodiment

Figure 8:
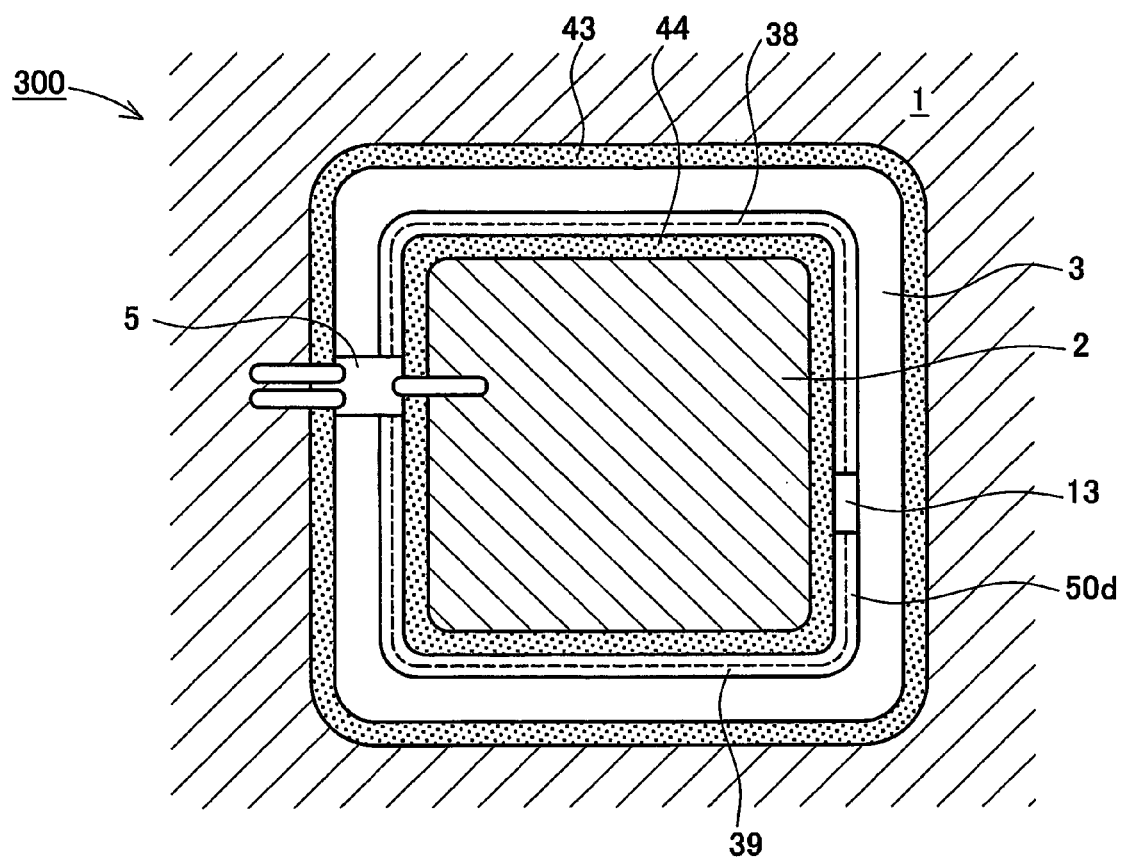
FIG. 8 is a plan view showing structure of a semiconductor apparatus directed to a third exemplary embodiment.

A semiconductor apparatus 300 in a third exemplary embodiment has a structure as shown in a plan view in FIG. 8. The semiconductor apparatus 300 comprises a low potential reference circuit region 1 and a high potential reference circuit region 2, and the high potential reference circuit region 2 is surrounded by a high withstand voltage separating region 3 same as in the semiconductor apparatus 100 in the first exemplary embodiment. Further, a high withstand voltage NMOS 5 is provided in part of the high withstand voltage separating region 3. An outer wall trench 43 and an inner wall trench 44 are also provided. The semiconductor apparatus 300 of this embodiment, unlike the semiconductor apparatus 100 in the first exemplary embodiment, does not have trench for partitioning the high withstand voltage separating region 3. It is hence effective to prevent lowering of withstand voltage due to crystal defects or the like likely to occur near the trench.

Figure 9:
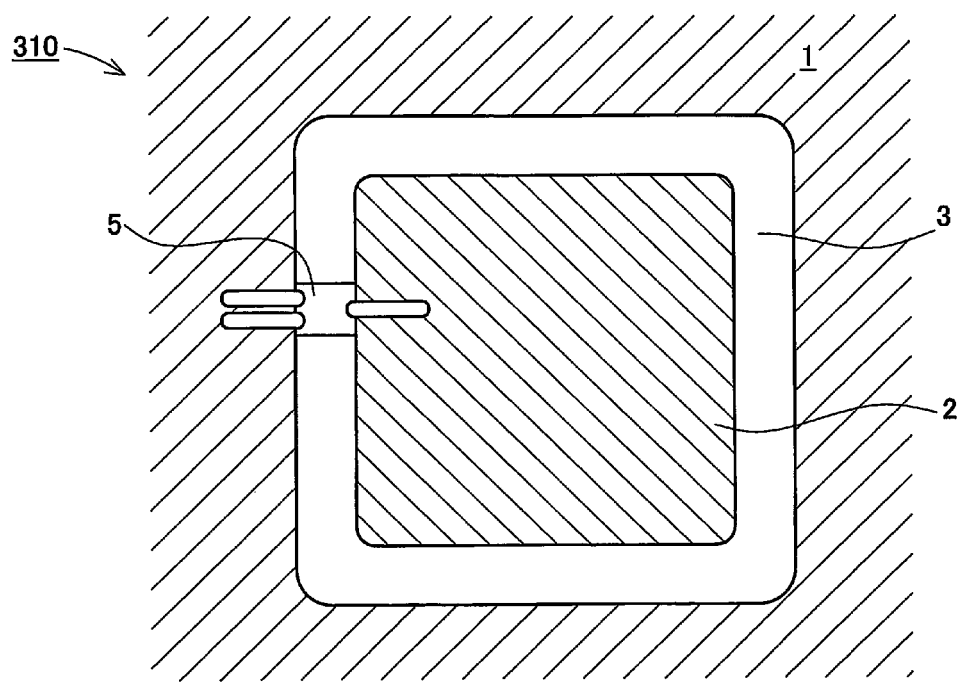
FIG. 9 is a plan view showing structure of a trench-less semiconductor apparatus, an applied example of the semiconductor apparatus directed to the third embodiment.

Only for the purpose of preventing lowering of withstand voltage due to crystal defects or the like near the trench, it is realized by a trenchless structure such as semiconductor apparatus 310 shown in FIG. 9. However, in the semiconductor apparatus 310, the drain N⁺ region of the high withstand voltage NMOS 5 and high potential reference N type layer are not separated, but they are connected electrically. Furthermore, if a plurality of high withstand voltage NMOS 5 or high withstand voltage PMOS 6 are provided in the high withstand voltage separating region 3, they cannot be separated. To solve such problem, in the semiconductor apparatus 300 of this embodiment, an inner wall trench 44 is provided for completely surrounding the high potential reference circuit region 2. As a result, the drain N⁺ region of the high withstand voltage NMOS 5 and high potential reference N type layer are isolated from each other. Further, a parasitic resistance of the high withstand voltage separating region 3 is generated along the inner wall trench 44. In the semiconductor apparatus 300 of the embodiment, the potential of the N⁺ region 50d, which is in the high withstand voltage separating region 3 and is near the high potential reference circuit region 2, is taken at position 13. The parasitic resistance between this position 13 and the N⁺ region 50d (drain N⁺ region) of the high withstand voltage NMOS 5 is a composite resistance of parasitic resistance route 38 and parasitic resistance route 39 in FIG. 8. Therefore, they can be disposed by disposing far from each other sufficiently, and the resistance value can be increased, so that effects of leak current can be decreased.

Fourth Exemplary Embodiment

Figure 10:
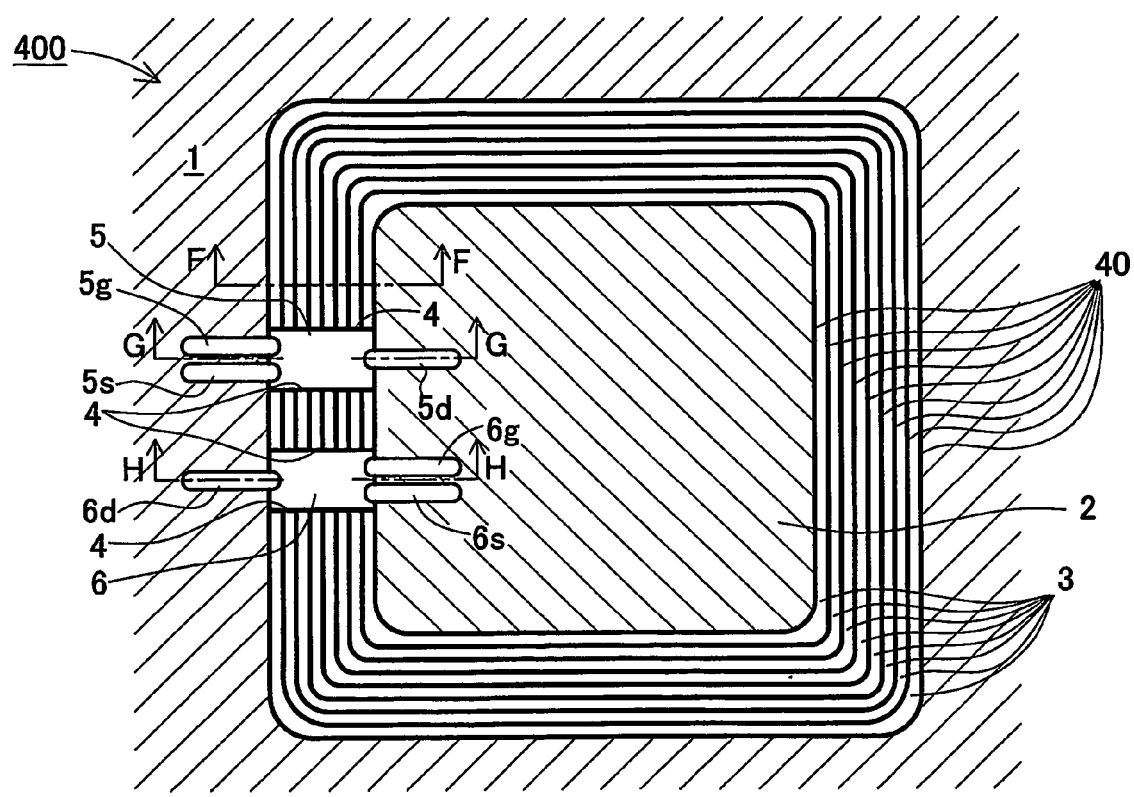
FIG. 10 is a plan view showing structure of a semiconductor apparatus directed to a fourth exemplary embodiment.

A semiconductor apparatus 400 in a fourth exemplary embodiment has a structure as shown in a plan view in FIG. 10. The semiconductor apparatus 400 comprises a low potential reference circuit region 1 and a high potential reference circuit region 2, and the high potential reference circuit region 2 is surrounded by a high withstand voltage separating region. 3. By this high withstand voltage separating region 3, the low potential reference circuit region 1 and high potential reference circuit region 2 are separated from each other. Further, within the high withstand voltage separating region 3, a trench group 40 in a loop form conforming to the shape of the high withstand voltage separating region 3 is formed. Each trench in the trench group 40 is filled with insulating material, and has capacitor structure. The high withstand voltage separating region 3 has portions partitioned by the trench 4, and in these partitioned portions, high withstand voltage NMOS 5 and high withstand voltage PMOS 6 for level shift are provided.

Figure 11:
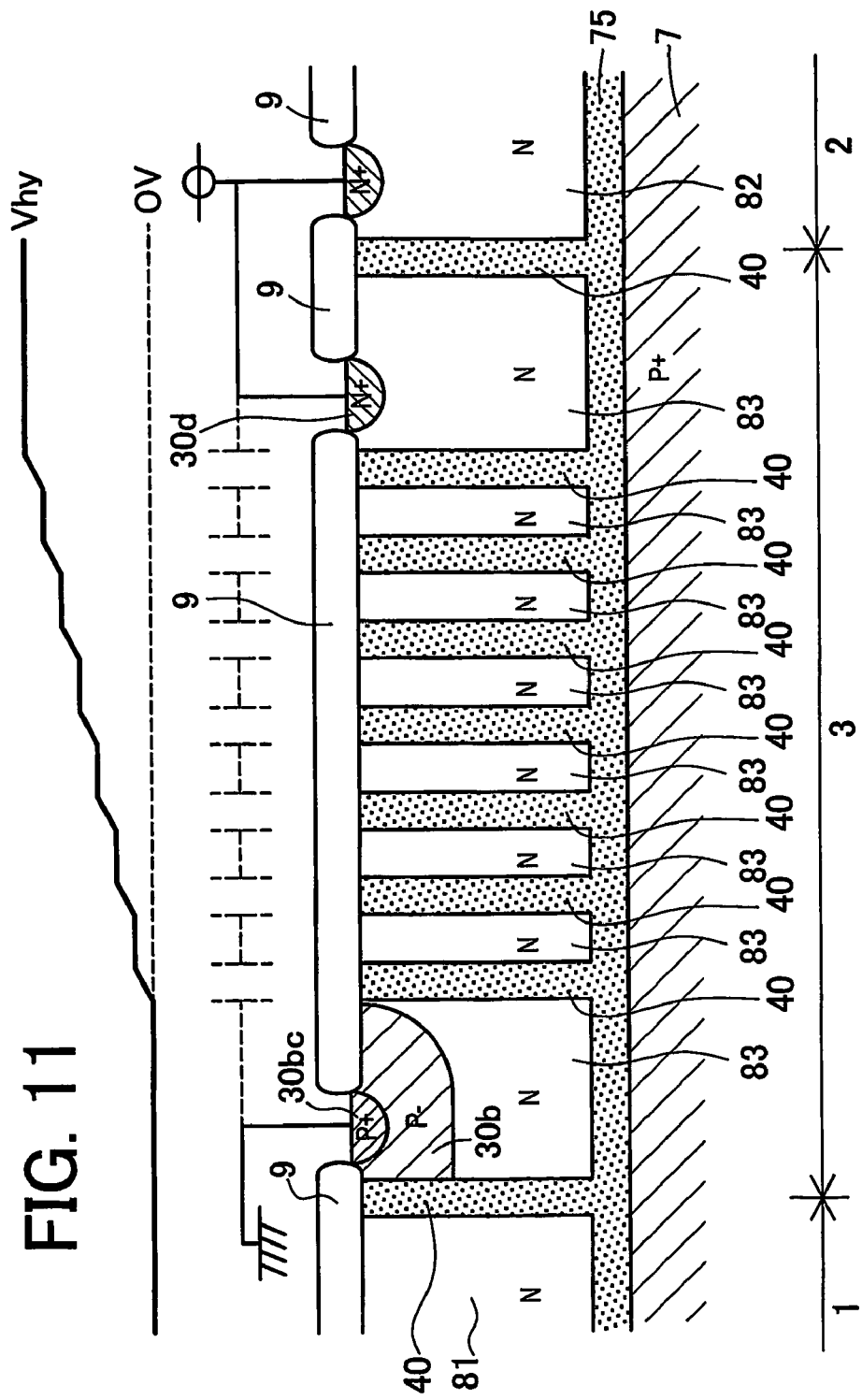
FIG. 11 is a sectional view showing structure of F-F section of the semiconductor apparatus directed to FIG. 10.

FIG. 11 is a sectional view of F-F of the semiconductor apparatus 400 shown in FIG. 10. The semiconductor apparatus 400 of this embodiment has an SOI structure, and includes an embedded insulating layer 75 formed between the P⁺type substrate 7 and epitaxial layers (low potential reference N type layer 81, high potential reference N type layer 82, and separating region N type layer 83). That is, the P⁺ type substrate 7 and epitaxial layer are insulated by the embedded insulating layer 75. The substrate positioned beneath the embedded insulating layer 75 may be either P type or N type. The separating region N type layer 83 is partitioned into plural regions by the trench group 40 the bottom of which reaches the embedded insulating layer 75. Of the regions partitioned by the trench group 40, the region closest to the low potential reference circuit region 1 includes P type diffusion regions 30b, 30bc corresponding respectively to the body P⁻ region 50b and body contact P⁺ region 50bc in the high withstand voltage NMOS 5 (see FIG. 12). The region closest to the high potential reference circuit region 2 includes N type diffusion region 30d corresponding to drain N⁺ region 50d in the high withstand voltage NMOS 5. The P type diffusion regions 30b, 30bc are equal in potential to the ground, and the N type diffusion region 30d is equal to the power source of the high potential reference circuit region 2. Potential of the main surface elevates step by step from the low potential reference circuit region 1 toward the high potential reference circuit region 2 by the effect of parasitic capacitance coupling generated by the trench group 40. The coupling ratio of the parasitic capacitance can be adjusted by the width of each trench in the trench group 40 at the stage of design.

Figure 12:
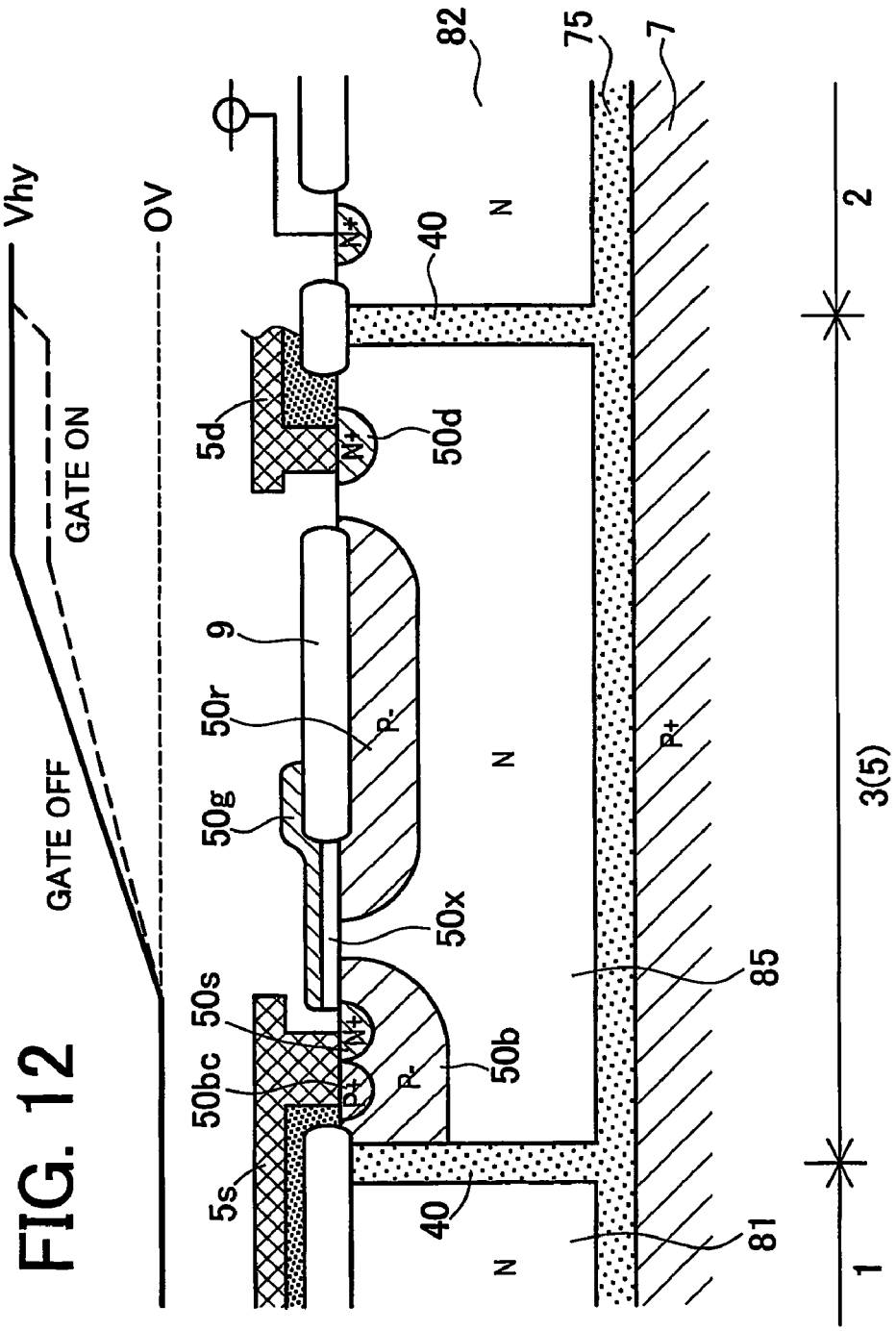
FIG. 12 is a sectional view showing structure of G-G section of the semiconductor apparatus directed to FIG. 10.

FIG. 12 is a sectional view of G-G in the semiconductor apparatus 400 shown in FIG. 10. It is a sectional view of high withstand voltage NMOS 5. The high withstand voltage NMOS 5 is formed in a position partitioned by the trench group 40 and trench 4, out of the N type epitaxial layers formed on the P+ type substrate 7. The high withstand voltage NMOS 5 includes gate poly silicon 50g, gate oxide film 50x, source N+ region 50s, drain N+ region 50d, body P− region 50b, and body contact P+ region 50bc. Further, on the P+ type substrate 7, in-NMOS drift layer 85 functioning as drift layer is provided. Above the in-NMOS drift layer 85, a resurf P− region 50r is formed. When a high voltage is applied between the source and drain a depletion layer is formed from the PN junction of the separating region N type layer 83 and resurf P− region 50r, so that a higher withstand voltage is realized. Here, the potential of the main surface elevates almost linearly between the source and drain.

Figure 13:
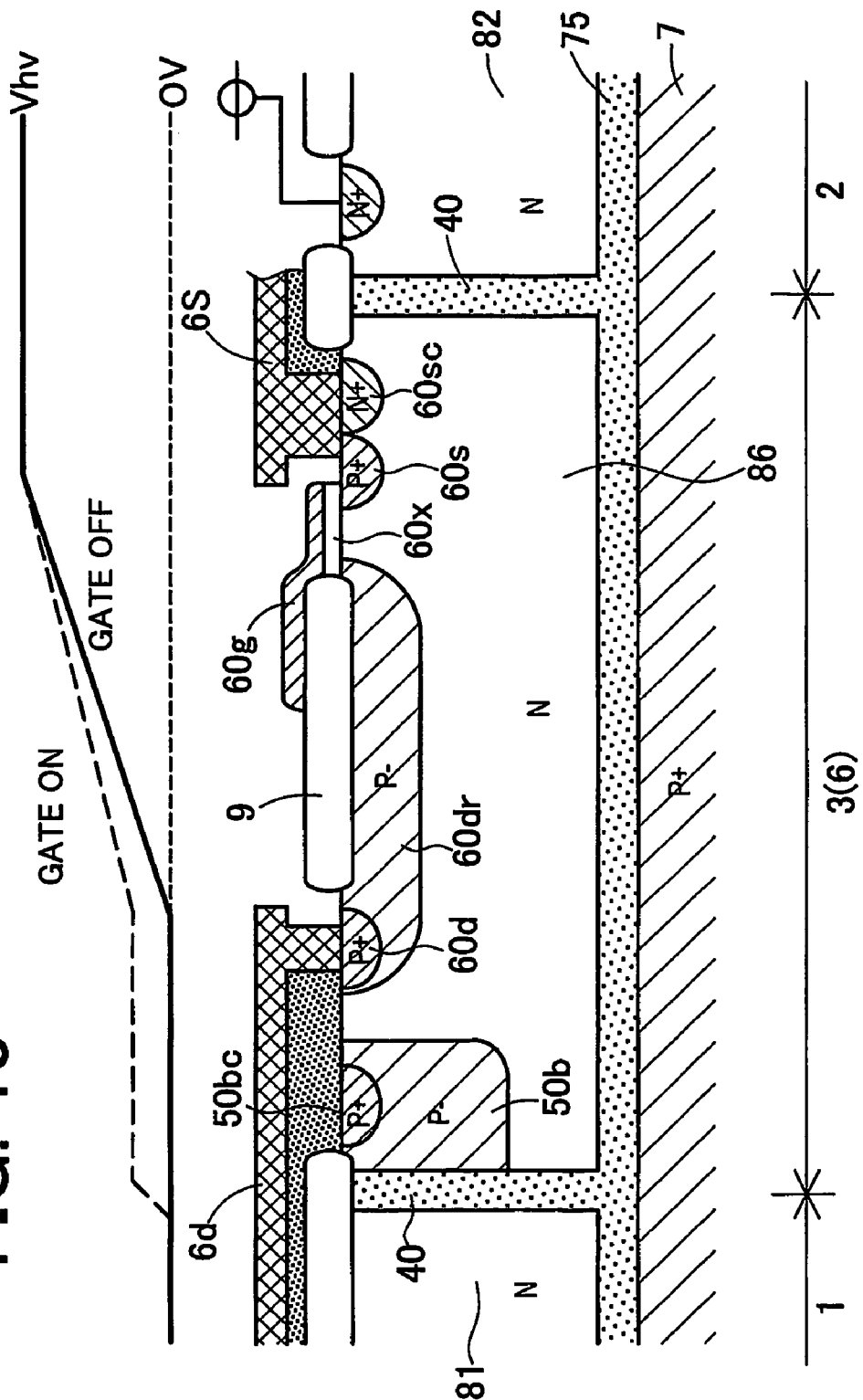
FIG. 13 is a sectional view showing structure of H-H section of the semiconductor apparatus directed to FIG. 10.

FIG. 13 is a sectional view of H-H in the semiconductor apparatus 400 shown in FIG. 10. It is a sectional view of high withstand voltage PMOS 6. The high withstand voltage PMOS 6, also, is formed in a region partitioned by the trench group 40 and trench 4, out of the N type epitaxial layers formed on the P+ type substrate 7. The high withstand voltage PMOS 6 includes gate poly silicon 60g, gate oxide film 60x, source P+ region 60s, drain P+ region 60d, and sub contact N+ region 60sc. Further, a drift P− region 60dr is formed in the same diffusion layer as the resurf P− region 50r of the high withstand voltage NMOS 5. When a high voltage is applied between the source and drain, the potential of the main surface elevates almost linearly between the source and drain.

It is a feature of the semiconductor apparatus 400 of the embodiment that the high withstand voltage NMOS 5 and the high withstand voltage PMOS 6 are disposed in regions where the high withstand voltage separating region 3 is partitioned by the trench 4, and that the trench group 40 of loop form is formed in the high withstand voltage separating region 3. As a result, at any position of the high withstand voltage separating region 3, high withstand voltage NMOS 5, and high withstand voltage PMOS 6, potential of the main surface elevates gradually from the low potential reference circuit region 1 toward the high voltage reference circuit region 2. That is, in the semiconductor apparatus 400 of the embodiment, the electric field distribution is similar at any position in the high withstand voltage separating region 3. Moreover, same as in the semiconductor apparatus in the first exemplary embodiment, the high potential drain wiring 5d in the high withstand voltage NMOS 5 does not straddle over low potential position. Also, the low potential drain wiring 6d in the high withstand voltage PMOS 6 does not straddle. over the high potential position. Therefore, as compared with the conventional semiconductor apparatus, lowering of withstand voltage is suppressed and concentration of electric field is also suppressed. in a simple structure.

Fifth Exemplary Embodiment

Figure 14:
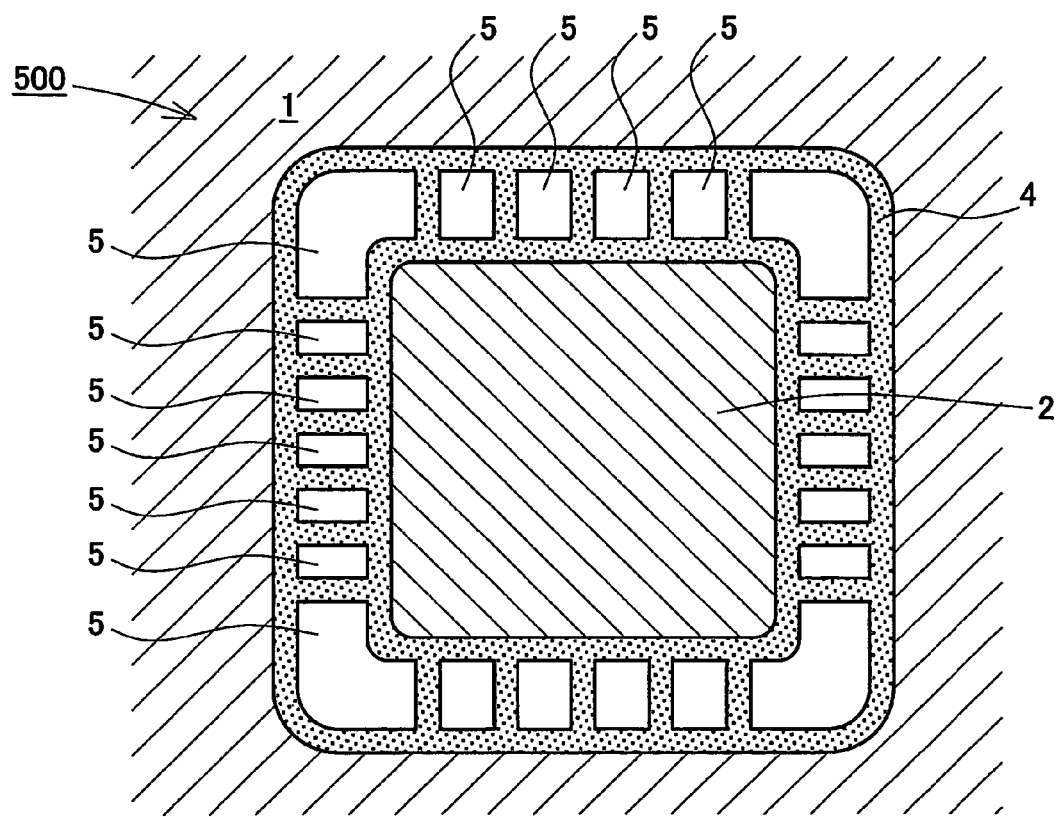
FIG. 14 is a plan view showing structure of a semiconductor apparatus directed to a fifth exemplary embodiment.

A semiconductor apparatus 500 in a fifth exemplary embodiment has a structure as shown in a plan view in FIG. 14. That is, the semiconductor apparatus 500 comprises a low potential reference circuit region 1 and a high potential reference circuit region 2. The high potential reference circuit region 2 is surrounded by a plurality of high withstand voltage NMOS 5 (or high withstand voltage PMOS 6). Each high withstand voltage NMOS 5 is surrounded by a trench 4.

The semiconductor apparatus 500 of the embodiment has the following features. That is, in the separating region between the low potential reference circuit region 1 and high potential reference circuit region 2, potential distribution is uniform. In the semiconductor apparatus 400 in the fourth exemplary embodiment (see FIG. 10), both potential distribution in the high withstand voltage separating region 3 (see FIG. 11) and potential distribution in the high withstand voltage NMOS 5 (see FIG. 12) elevate gradually, but there is a slight difference. As a result, there can be a case where a problem of withstand voltage may occur. By contrast, in the semiconductor apparatus 500 of the embodiment, although undesired high withstand voltage NMOS 5 is contained the potential distribution is nearly uniform at any position, and there is no problem of withstand voltage or electric field concentration. Incidentally, undesired high withstand voltage NMOS 5 causes no inconvenience by turning off the gate.

Sixth Exemplary Embodiment

Figure 15:
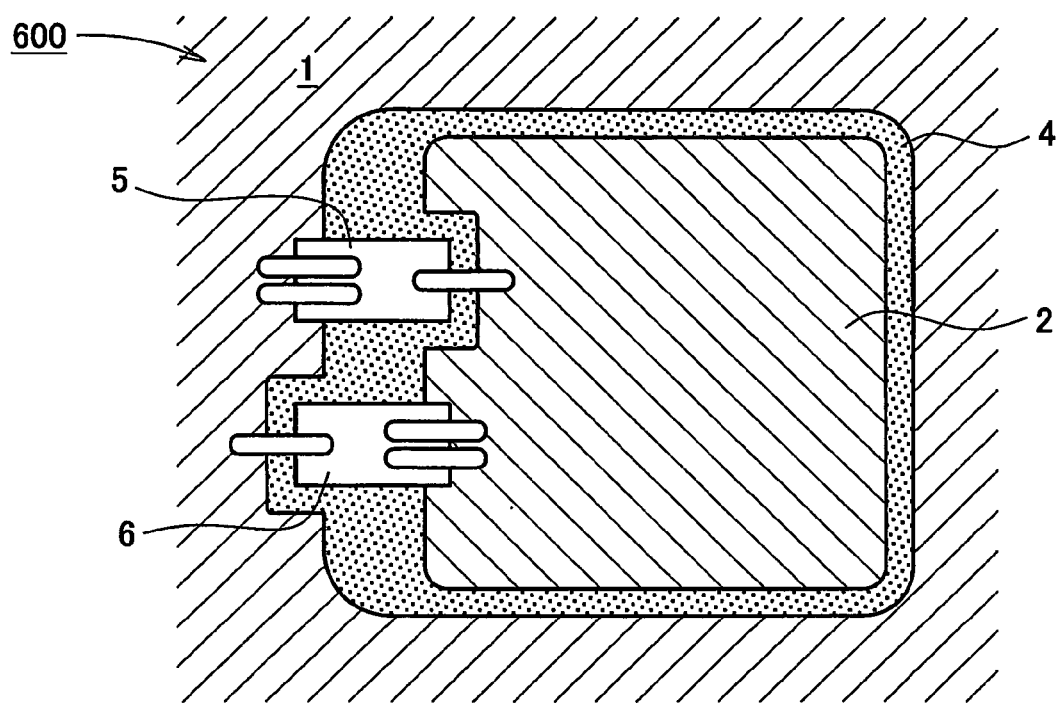
FIG. 15 is a plan view showing structure of a semiconductor apparatus directed to a sixth exemplary embodiment.

A semiconductor apparatus 600 in a sixth exemplary embodiment has a structure as shown in a plan view in FIG. 15. That is, the semiconductor apparatus 600 comprises a low potential reference circuit region 1 and a high potential reference circuit region 2. The high potential reference circuit region 2 is surrounded by a trench 4. The trench 4 is filled with insulating material. That is, the region between the low potential reference circuit region 1 and high potential reference circuit region 2 is filled with insulating material. In the position partitioned by the trench 4, high withstand voltage NMOS 5 or high withstand voltage PMOS 6 for level shift is provided.

In the semiconductor apparatus 600 of the embodiment, potential in the portion of the trench 4 elevates linearly from the low potential reference circuit region 1 toward the high potential reference circuit region 2. As a result, potential distribution is nearly uniform at any position same as in the fifth exemplary embodiment, and it is free from problem of withstand voltage. The width can be narrowed in the positions other than the positions adjacent to the high withstand voltage NMOS 5 or high withstand voltage PMOS 6 of the trench 4. Hence, the chip area can be saved substantially. Generally, about 0.1 μm/V is needed near high withstand voltage MOS, that is, about 100 μm is needed at withstand voltage of 1000 V, but in other positions, only about $3 \times 10^{-3}$ μm/V is needed, that is, 3 μm is enough at withstand voltage of 1000V.

As described specifically above, in the semiconductor apparatus 100 of the first exemplary embodiment, the high withstand voltage separating region 3 is provided between the low potential reference circuit region 1 and high potential reference circuit region 2. Further, at the outer periphery of the high withstand voltage separating region 3, the trench 4 is formed so that its bottom reach the P− type substrate 7, and the low potential reference circuit region 1 and high potential reference circuit region 2 are completely separated from each other. Further, the high withstand voltage separating region 3 is partitioned by the trench 4, and the high withstand voltage NMOS 5 and high withstand voltage PMOS 6 are provided in partitioned positions. The drain wiring 5d of the high withstand voltage NMOS 5 is formed on the surface of the semiconductor device so as to straddle over the trench 4. As a result, the drain wiring 5d does not straddle over the high withstand voltage separating region 3, and it is free from effects of drain wiring 5d which is high in potential (low potential in high withstand voltage PMOS 6). Besides, since each high withstand voltage MOS and the low potential reference circuit region 1 and high potential reference circuit region 2 are completely insulated, leak current does not occur, and meander portion for increasing the parasitic resistance is not required. In the semiconductor apparatus 100, since the withstand voltage can be adjusted by the size of the trench 4, if the required voltage is different, it can be easily satisfied in the designing stage. That is, the degree of freedom of design is high. Therefore, in the semiconductor apparatus combining the low potential reference circuit and high potential reference circuit, the level can be shifted between the low potential reference circuit and high potential reference circuit, and a compact semiconductor apparatus excellent in withstand voltage is realized.

In the semiconductor apparatus 200 of the second exemplary embodiment, no trench is formed in the wall of the source wiring side or outer wall of the high withstand voltage separating region. Therefore, the yield is enhanced, and the semiconductor apparatus is formed in a compact design. In the semiconductor apparatus 300 of the third exemplary embodiment, there is no trench for partitioning the high withstand voltage separating region 3 and high withstand voltage NMOS 5. Hence, it prevents lowering of withstand voltage due to crystal defects or the like likely to occur near the trench.

In the semiconductor apparatus 400 of the fourth exemplary embodiment, the trench group 40 in loop form is formed in the high withstand voltage separating region 3. Accordingly, potential of the main surface in the high withstand voltage separating region 3 elevates slowly from the low potential reference circuit region 1 toward the high potential reference circuit. region 2, and the problem of concentration of electric field is alleviated. In the semiconductor apparatus 500 of the fifth exemplary embodiment, the high potential reference circuit region 2 is surrounded by the high withstand voltage MOS. As a result, in the region between the low potential reference circuit region 1 and high potential reference circuit region 2, the potential distribution is nearly uniform at any position, and it is free from problem of withstand voltage in the separating region. In the semiconductor apparatus 600 of the sixth exemplary embodiment, the region between the low potential reference circuit region 1 and high potential reference circuit region 2 is filled up with insulating material. In such embodiment, too, potential distribution is nearly uniform at any position of the region filled with insulating material, and it is free from problem of withstand voltage in the separating region.

The foregoing embodiments are mere examples, and are not intended to limit the scope of the invention in any respect. Therefore, the invention may be changed and modified in various forms within a range not departing from the true spirit thereof. For example, the semiconductor regions may be exchanged between P type and N type. The semiconductor is not limited to silicon, but other semiconductors may be used as well (SiC, GaN, GaAs, etc.).

INDUSTRIAL APPLICABILITY

The semiconductor apparatus of the invention has a relay semiconductor element in a high withstand voltage separating region, and the output wiring of the relay semiconductor element is disposed so as to straddle over an insulating partition wall. It is hence free from effects of output wiring which is high in potential. By the insulating partition wall, the relay semiconductor element is insulated from other circuit regions. Hence, measure against leak current such as a meander portion is not needed. Therefore, the invention presents a semiconductor apparatus combining a low potential reference circuit and high potential reference circuit, in which the level can be shifted between the low potential reference circuit and high potential reference circuit, and a compact semiconductor apparatus excellent in withstand voltage is realized.

The invention claimed is:

1. A semiconductor apparatus containing a lower potential reference circuit region and a higher potential reference circuit region between which signals are transmitted, the signals at the lower potential reference circuit region having a potential lower than the signals at the higher potential reference circuit region, the semiconductor apparatus comprising:

a substrate region;

an epitaxial layer provided on the substrate region;

a high withstand voltage separating region formed in the epitaxial layer, which is arranged between the low and high potential reference circuit regions separating the lower potential reference circuit region from the higher potential reference circuit region;

a relay semiconductor device, formed in a doped region of the high withstand voltage separating region in the epitaxial layer, for transmitting a signal from one of the low and high potential reference circuit regions to the other of them, wherein the potential at the lower potential reference circuit region is lower than the potential at the higher potential reference circuit region; and an insulating partition arranged between the relay semiconductor device and one of the low and high potential reference circuit regions that is at an output of the relay semiconductor device, the insulating partition being filled with insulating material in a trench extending to the substrate region and partitioning the epitaxial layer to separate the relay semiconductor device from the low potential reference circuit and the high potential reference circuit, wherein output wiring of the relay semiconductor device is wired to an output of at least one of the low and high potential reference circuit regions bridging over the insulating partition.

2. A semiconductor apparatus according to claim 1 wherein the substrate region arranged below the lower and higher potential reference circuit regions, wherein bottom portion of the insulating partition extends to the substrate region, and the insulation partition surrounds the relay semiconductor device.

3. A semiconductor apparatus according to claim 1 wherein the insulating partition comprises a group of insulating partitions arranged between the lower higher potential reference circuit regions, the group of insulating partitions dividing space between the lower and higher potential reference circuit regions into plural regions.

4. A semiconductor apparatus according to claim 2 wherein the insulating partition comprises a group of insulating partitions arranged between the lower and higher potential reference circuit regions, the group of insulating partitions dividing space between the lower and higher potential reference circuit regions into plural regions.

5. A semiconductor apparatus according to claim 1, wherein the high withstand voltage separating region surrounds one of the lower and higher potential reference circuit regions, a plurality of the relay semiconductor devices are arranged to form a ring shape in the high withstand voltage separating region, each relay semiconductor device is surrounded with the insulating partition, and output wiring of each relay semiconductor device is wired to at least one output of either the lower potential reference circuit region or the higher potential reference circuit region bridging over the insulating partition.

6. A semiconductor apparatus according to claim 1 further comprising:

wherein the substrate region is arranged below the lower and higher potential reference circuit regions; and an insulating layer embedded between the lower and higher potential reference circuit regions and the substrate region, the insulating layer electrically insulating the lower and higher potential reference circuit regions from the substrate region, wherein bottom portions of the insulating partitions extend to the insulating layer and the insulating partitions surround the relay semiconductor devices.

7. A semiconductor apparatus according to claim 5 further comprising:

wherein the substrate is region arranged below the lower and higher potential reference circuit regions; and an insulating layer embedded between the lower and higher potential reference circuit regions and the substrate region, the insulating layer electrically insulating the lower and higher potential reference circuit regions from the substrate region, wherein bottom portions of the insulating partitions extend to the insulating layer and the insulating partitions surround the relay semiconductor device.

8. A semiconductor apparatus according to claim 1 comprising:

wherein the substrate region is formed from semiconductor materials of a first conduction type;

wherein the lower and higher potential reference circuit regions are regions formed from semiconductor materials of a second conduction type formed over a main surface of the substrate region so that one of either the lower potential reference circuit region or the higher potential reference circuit region regions surrounds and is separated from the other, and the high withstand voltage separating region is a region formed in a ring shape between the lower and higher potential reference circuit regions.

9. A semiconductor apparatus according to claim 1 further comprising:

wherein the substrate region of is formed from semiconductor materials of either a first or a second conduction type; and an insulating film formed on the substrate region;

wherein the lower and higher potential reference circuit regions are regions of second conduction type formed on the insulating film so that one of the regions surrounds and is separate from the other, and the high withstand voltage separating region includes a region formed in a ring shape between the lower and higher potential reference circuit regions.

10. A semiconductor apparatus according to claim 8, wherein a bottom portion of the insulating partition extends to the substrate region, and the insulating partition surrounds a periphery of the relay semiconductor device from at least three directions.

11. A semiconductor apparatus according to claim 9, wherein a bottom portion of the insulating partition extends to the insulating film, and the insulating partition surrounds periphery of the relay semiconductor device from at least three directions.

12. A semiconductor apparatus according to claim 8, wherein the high withstand voltage separating region composes junction isolation-type structure in which high withstand voltage is maintained by a PN junction.

13. A semiconductor apparatus according to claim 9, wherein the high withstand voltage separating region composes junction isolation-type structure in which high withstand voltage is maintained by a PN junction.

14. A semiconductor apparatus according to claim 8, wherein the high withstand voltage separating region has insulation isolation-type structure in which high withstand voltage is maintained by a plurality of insulating partitions.

15. A semiconductor apparatus according to claim 9, wherein the high withstand voltage separating region has insulation isolation-type structure in which high withstand voltage is maintained by a plurality of insulating partitions.

16. A semiconductor apparatus according to claim 14, wherein regions partitioned by the plurality of insulating partitions within the high withstand voltage separating region have a capacitor structure in which the plurality of insulating partitions works as dielectric film, and potential elevates gradually from the lower potential reference circuit region toward the higher potential reference circuit region.

17. A semiconductor apparatus according to claim 15, wherein regions partitioned by the plurality of insulating partitions within the high withstand voltage separating region have a capacitor structure in which the plurality of insulating partitions works as dielectric film, and potential elevates gradually from the lower potential reference circuit region toward the higher potential reference circuit region.

18. A semiconductor apparatus according to claim 1 further comprising:

the substrate region is formed from semiconductor materials of a first conduction type;

wherein the lower and higher potential reference circuit regions are regions formed from semiconductor materials of a second conduction type formed on a main surface of the substrate region so that one of either the lower potential reference circuit region or the higher potential reference circuit region regions surrounds and is separated from the other, and the relay semiconductor device comprises a plurality of relay semiconductor devices are arranged to form a ring shape in the high withstand voltage separating region.

19. A semiconductor apparatus according to claim 1 further comprising:

wherein the substrate region is formed from semiconductor materials either a first or a second conduction type; and an insulating film formed on the substrate region;

wherein the lower and higher potential reference circuit regions are regions of second conduction type formed on the insulating film so that one of the regions surrounds and is separate from the other, and the relay semiconductor device comprises a plurality of relay semiconductor devices are arranged to form a ring shape in the high withstand voltage separating region.

20. A semiconductor apparatus according to claim 18, wherein a bottom portion of the insulating partition extends to the substrate region, and the insulating partition surrounds a periphery of the relay semiconductor device from at least three directions.

21. A semiconductor apparatus according to claim 19, wherein a bottom portion of the insulating partition extends to the insulating film, and the insulating partition surrounds a periphery of the relay semiconductor device from at least three directions.

22. A semiconductor apparatus according to claim 5 Comprising:
   the substrate region is formed from semiconductor materials of a first conduction type,
   wherein the lower and higher potential reference circuit regions are regions formed from semiconductor materials of a second conduction type formed over a main surface of the substrate region so that one of either the lower potential reference circuit region or the higher potential reference circuit region regions surrounds and is separate from the other.

* * * * *

UNITED STATES PATENT AND TRADEMARK OFFICE
CERTIFICATE OF CORRECTION

PATENT NO. : 7,538,407 B2
APPLICATION NO. : 10/576292
DATED : May 26, 2009
INVENTOR(S) : Masato Taki et al.

Page 1 of 1

It is certified that error appears in the above-identified patent and that said Letters Patent is hereby corrected as shown below:

| Column | Line | |
|---|---|---|
| 6 | 14 | After "partition." Change "it" to --It--. |
| 6 | 52 | Change "one of. the" to --one of the--. |
| 10 | 50 | Change "method. of" to --method of--. |
| 12 | 21 | After "region" delete ".". |
| 13 | 49 | After "suppressed" delete ".". |
| 16 | 41 | After "lower" insert --and--. |
| 17 | 30 | Before "surrounds" delete "regions". |
| 17 | 37 | After "region" delete "of". |
| 17 | 58 | After "surrounds" insert --a--. |
| 20 | 4 | Before "surrounds" delete "regions". |

Signed and Sealed this

Twenty-third Day of February, 2010

David J. Kappos
*Director of the United States Patent and Trademark Office*